US010845329B2

(12) United States Patent
Sawada et al.

(10) Patent No.: US 10,845,329 B2
(45) Date of Patent: Nov. 24, 2020

(54) ION CONCENTRATION DISTRIBUTION MEASURING DEVICE

(71) Applicants: National University Corporation TOYOHASHI UNIVERSITY OF TECHNOLOGY, Toyohashi (JP); HAMAMATSU PHOTONICS K.K., Hamamatsu (JP)

(72) Inventors: Kazuaki Sawada, Toyohashi (JP); Hiroo Yamamoto, Hamamatsu (JP); Seiichiro Mizuno, Hamamatsu (JP); Toshiki Wakamori, Hamamatsu (JP)

(73) Assignees: NATIONAL UNIVERSITY CORPORATION TOYOHASHI UNIVERSITY OF TECHNOLOGY, Toyohashi (JP); HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/481,979

(22) PCT Filed: Feb. 8, 2018

(86) PCT No.: PCT/JP2018/004447
§ 371 (c)(1),
(2) Date: Jul. 30, 2019

(87) PCT Pub. No.: WO2018/151012
PCT Pub. Date: Aug. 23, 2018

(65) Prior Publication Data
US 2019/0391110 A1 Dec. 26, 2019

(30) Foreign Application Priority Data

Feb. 16, 2017 (JP) .................................. 2017-027234

(51) Int. Cl.
*G01N 27/22* (2006.01)
*G01N 27/414* (2006.01)
*H01L 27/146* (2006.01)

(52) U.S. Cl.
CPC ....... *G01N 27/4148* (2013.01); *G01N 27/227* (2013.01); *H01L 27/14643* (2013.01)

(58) Field of Classification Search
CPC ...... G01N 27/00; G01N 27/22; G01N 27/227; G01N 27/414; G01N 27/4148; H01L 27/14643
(Continued)

(56) References Cited

U.S. PATENT DOCUMENTS 4,977,096 A * 12/1990 Shimada ........... H01L 27/14665
148/DIG. 14
2008/0180555 A1 * 7/2008 Sato .................... H04N 5/37452
348/248
2016/0290958 A1 10/2016 Ram et al.

FOREIGN PATENT DOCUMENTS

JP H10-122957 A 5/1998
JP 2013-540259 A 10/2013
(Continued)

OTHER PUBLICATIONS

Shin Watanabe et al., "Realized pH Imaging with 1.15μM Pitch by New Structure 2Tr.Type Sensor," APCOT, 2016, 3d.5, pp. 135-136.
(Continued)

*Primary Examiner* — Chuong A Luu
(74) *Attorney, Agent, or Firm* — Faegre Drinker Biddle & Reath LLP

(57) ABSTRACT

An ion concentration distribution measurement device includes a unit detection element for outputting charges of an amount according to an ion concentration, and an integration circuit for outputting a signal value according to the amount of charges which are output from the unit detection
(Continued)

element. The unit detection element includes a MOS transistor, an ion sensitive portion, a first capacitive portion, and a transfer switch. The integration circuit includes an amplifier, a second capacitive portion, and a reset switch.

6 Claims, 11 Drawing Sheets

(58) Field of Classification Search
USPC .......................................................... 257/253
See application file for complete search history.

(56) References Cited

FOREIGN PATENT DOCUMENTS

| WO | WO-2012/003380 A2 | 1/2012 |
| WO | WO-2016/114202 A1 | 7/2016 |
| WO | WO-2016/147798 A1 | 9/2016 |

OTHER PUBLICATIONS

International Repliminary Report on Patentability dated Aug. 29, 2019 for PCT/JP2018/004447.

* cited by examiner

ION CONCENTRATION DISTRIBUTION MEASURING DEVICE

TECHNICAL FIELD

The present invention relates to a device for measuring a distribution of an ion concentration.

BACKGROUND ART

As an ion sensor for measuring an ion concentration in a solution, a sensor that uses an ion sensitive field effect transistor (ISFET) is known. The ion sensor includes a FET including a gate electrode which is covered with an ion sensitive film. The ion sensor controls a current between a drain and a source of the FET in accordance with a surface potential of the ion sensitive film which is generated by ion activity in a solution, and detects a current value to measure the ion concentration.

Further, Patent Documents 1, 2, and Non-Patent Document 1 disclose an ion concentration distribution measurement device (ion image sensor) in which a plurality of unit detection elements each detecting an ion concentration are arranged. Each of the unit detection elements includes a MOS transistor including a gate electrode to which an ion sensitive film is electrically connected. The ion concentration distribution measurement device generates charges of an amount according to a surface potential of the ion sensitive film in the unit detection element, and detects a voltage value according to the amount of charges to measure the ion concentration distribution.

CITATION LIST

Patent Literature

Patent Document 1: International Publication No. 2016/114202
Patent Document 2: International Publication No. 2016/147798

Non Patent Literature

Non-Patent Document 1: S. Watanabe et al., "Realized pH Imaging with 1.15 µM Pitch by New Structure 2Tr.Type Sensor", APCOT2016, 3d.5, pp. 135-136

SUMMARY OF INVENTION

Technical Problem

The ion concentration distribution measurement device disclosed in Patent Documents 1, 2, and Non-Patent Document 1 is regarded to have excellent characteristics in comparison to the ISFET. However, according to findings obtained by the present inventors, the ion concentration distribution measurement device has a problem of being easily influenced by noise.

The present invention has been made in order to solve the above problem, and an object thereof is to provide an ion concentration distribution measurement device that is not easily influenced by noise.

Solution to Problem

An ion concentration distribution measurement device according to the present invention includes a detection unit including a plurality of unit detection elements each outputting charges of an amount according to an ion concentration arranged and formed one-dimensionally or two-dimensionally on a semiconductor substrate; and a signal processing unit including one or two or more integration circuits each outputting a signal value according to the amount of charges output from the unit detection element.

Each of the unit detection elements includes (1) a MOS transistor including a first electrode, a second electrode, and a gate electrode, (2) an ion sensitive portion electrically connected to the gate electrode of the MOS transistor, and applying a potential according to the ion concentration to the gate electrode, (3) a first capacitive portion provided between the second electrode of the MOS transistor and a reference potential input terminal, and accumulating charges of an amount according to the potential of the gate electrode, and (4) a transfer switch including a first terminal and a second terminal, and outputting charges accumulated in the first capacitive portion from the second terminal, the first terminal being electrically connected to the second electrode of the MOS transistor. Here, one electrode of the first electrode and the second electrode of the MOS transistor is a drain electrode, and the other electrode is a source electrode.

Each of the integration circuits includes (1) an amplifier including a first input terminal to which charges output from any one unit detection element among the plurality of unit detection elements are input, a second input terminal to which a reference potential is input, and an output terminal outputting a signal value, (2) a second capacitive portion provided between the first input terminal and the output terminal of the amplifier, and accumulating charges input to the first input terminal of the amplifier, and (3) a reset switch provided in parallel with the second capacitive portion, and resetting charge accumulation in the second capacitive portion. The integration circuit outputs a signal value according to the amount of charges accumulated in the second capacitive portion from the output terminal of the amplifier.

Advantageous Effects of Invention

The ion concentration distribution measurement device according to the present invention is not easily influenced by noise, and is capable of measuring an ion concentration distribution with high accuracy.

DESCRIPTION OF EMBODIMENTS

Hereinafter, embodiments for carrying out the present invention will be described in detail with reference to the accompanying drawings. In the description of the drawings, the same elements will be denoted by the same reference signs, without redundant description. The present invention is not limited to these examples.

First Embodiment

Figure 1:
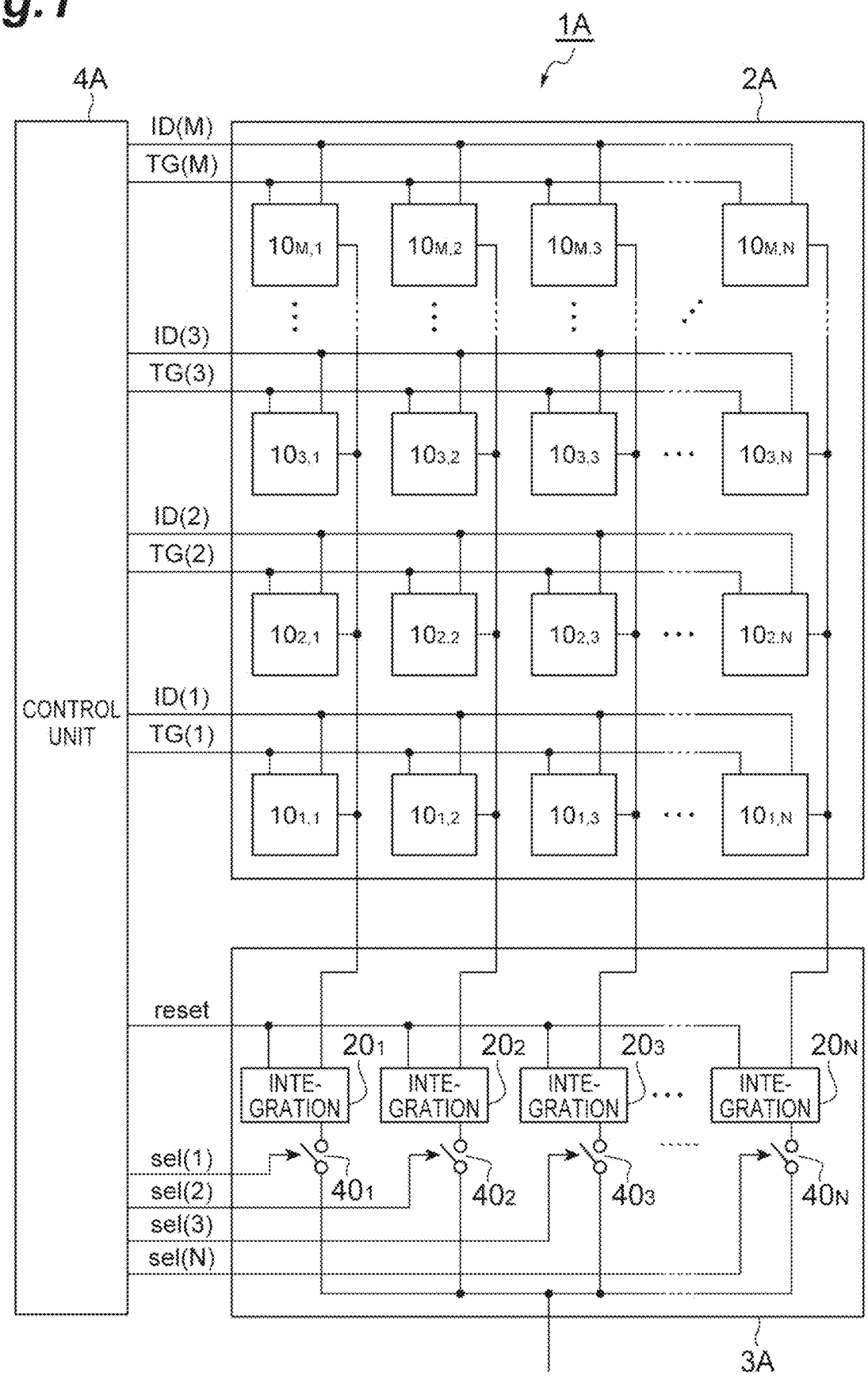
FIG. 1 is a diagram illustrating an entire configuration of an ion concentration distribution measurement device 1A of a first embodiment.

FIG. 1 is a diagram illustrating an entire configuration of an ion concentration distribution measurement device 1A of a first embodiment. The ion concentration distribution measurement device 1A includes a detection unit 2A, a signal processing unit 3A, and a control unit 4A. The detection unit 2A is formed on a semiconductor substrate. It is preferable that the signal processing unit 3A is also formed on the semiconductor substrate, and further, it is preferable that the control unit 4A is further formed thereon.

The detection unit 2A includes M×N unit detection elements $10_{1,1}$ to $10_{M,N}$. The M×N unit detection elements $10_{1,1}$ to $10_{M,N}$ have a common configuration, and are two-dimensionally arranged in M rows and N columns. Each of the unit detection elements $10_{m,n}$ is located at an m-th row and an n-th column. The unit detection element $10_{m,n}$ operates on the basis of an ID(m) signal and a TG(m) signal which are applied from the control unit 4A, and outputs charges of an amount according to an ion concentration to the signal processing unit 3A. Here, M and N are each an integer of 2 or more, m is an integer of 1 or more and M or less, and n is an integer of 1 or more and N or less.

The signal processing unit 3A includes N integration circuits $20_1$ to $20_N$ and N switches $40_1$ to $40_N$. The N integration circuits $20_1$ to $20_N$ have a common configuration. Each of the integration circuits $20_n$ is connected to the M unit detection elements $10_{1,n}$ to $10_{M,n}$ in an n-th column of the detection unit 2A. The integration circuit $20_n$ operates on the basis of a reset signal which is applied from the control unit 4A, inputs and accumulates charges sequentially output from the M unit detection elements $10_{1,n}$ to $10_{M,n}$ in an n-th column, and outputs a signal value according to the amount of accumulated charges.

Each of the switches $40_n$ is connected to an output terminal of the integration circuit $20_n$, and operates on the basis of a sel(n) signal which is applied from the control unit 4A. When sequentially entering an ON state, the N switches $40_1$ to $40_N$ sequentially output signal values, which are respectively output from the N integration circuits $20_1$ to $20_N$, to a common output line.

The control unit 4A controls respective operations of the detection unit 2A and the signal processing unit 3A. The control unit 4A outputs the ID(m) signal and the TG(m) signal for controlling an operation of the unit detection element $10_{m,n}$ of the detection unit 2A. Further, the control unit 4A outputs the reset signal for controlling an operation of the integration circuit $20_n$ of the signal processing unit 3A, and further, outputs the sel(n) signal for controlling an operation of the switch $40_n$ of the signal processing unit 3A.

Figure 2:
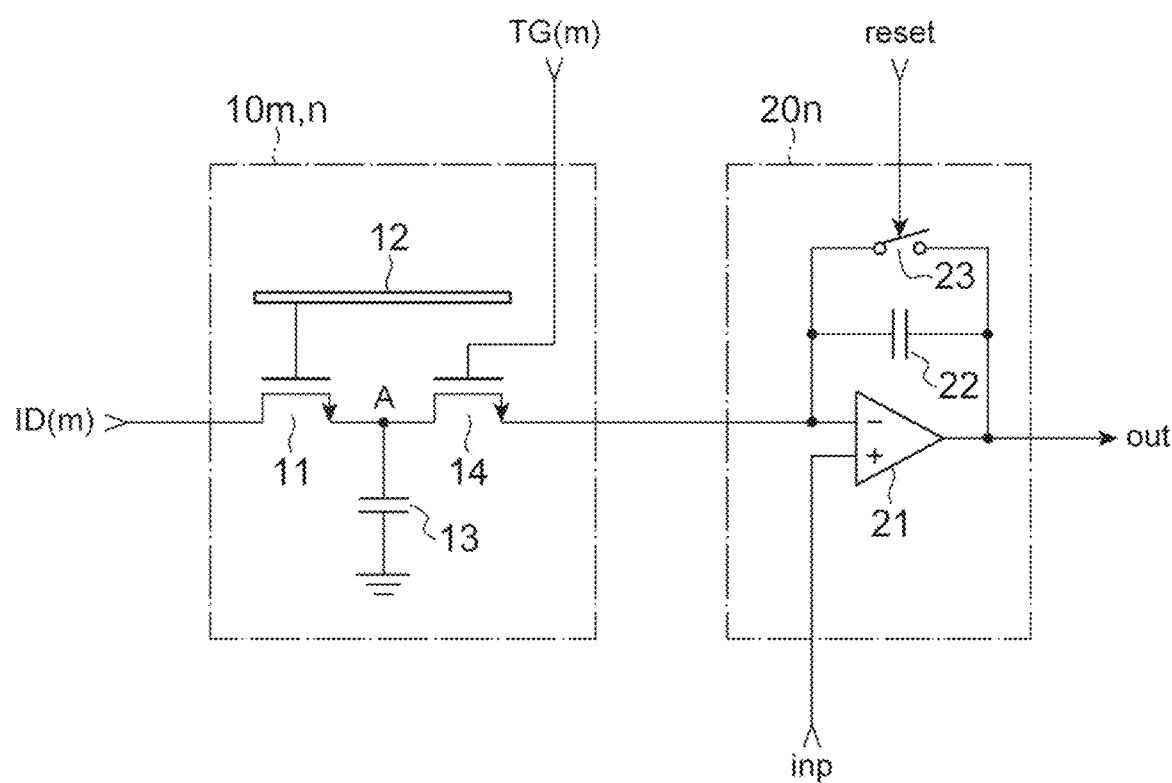
FIG. 2 is a diagram illustrating a circuit configuration example of a unit detection element $10_{m,n}$ and an integration circuit $20_n$ of the ion concentration distribution measurement device 1A of the first embodiment.

FIG. 2 is a diagram illustrating a circuit configuration example of the unit detection element $10_{m,n}$ and the integration circuit $20_n$ of the ion concentration distribution measurement device 1A of the first embodiment. In the drawing, a unit detection element $10_{m,n}$ in an m-th row and an n-th column among the M×N unit detection elements $10_{1,1}$ to $10_{M,N}$ is representatively illustrated, and an integration circuit $20_n$ that is connected to the unit detection element $10_{m,n}$ among the N integration circuits $20_1$ to $20_N$ is representatively illustrated.

The unit detection element $10_{m,n}$ includes a MOS transistor 11, an ion sensitive portion 12, a capacitive portion (first capacitive portion) 13, and a transfer switch 14.

The MOS transistor 11 is, for example, an NMOS transistor, and includes a drain electrode (first electrode), a source electrode (second electrode), and a gate electrode. The ID(m) signal that is applied from the control unit 4A is input to the drain electrode of the MOS transistor 11.

The ion sensitive portion 12 is electrically connected to the gate electrode of the MOS transistor 11, and applies a potential according to an ion concentration to the gate electrode. For example, $Si_3N_4$, $Ta_2O_5$, or the like is used as the ion sensitive portion 12. It is preferable that the ion sensitive portion 12 is provided to cover at least a part of both or any one of the MOS transistor 11 and the transfer switch 14, and in this case, it is possible to reduce a layout area of the unit detection element $10_{m,n}$ on the semiconductor substrate.

The capacitive portion 13 is provided between the source electrode of the MOS transistor 11 and a reference potential input terminal (for example, a ground potential input terminal), and accumulates charges of an amount according to the potential of the gate electrode of the MOS transistor 11. It is preferable that the capacitive portion 13 is a parasitic capacitor, and in this case, it is possible to reduce the layout area of the unit detection element $10_{m,n}$ on the semiconductor substrate. Further, the capacitive portion 13 may be intentionally provided, and for example, when the capacitive portion is a MIM (metal-oxide-metal) capacitor, it is possible to reduce the layout area of the unit detection element $10_{m,n}$ on the semiconductor substrate.

The transfer switch 14 includes a first terminal and a second terminal. The first terminal of the transfer switch 14 is electrically connected to the source electrode of the MOS transistor 11. The transfer switch 14 operates on the basis of the TG(m) signal that is applied from the control unit 4A. In an ON state, the transfer switch 14 of the unit detection element $10_{m,n}$ outputs charges accumulated in the capacitive portion 13 to the integration circuit $20_n$ from the second terminal. The transfer switch 14 can be constituted by, for example, an NMOS transistor.

Here, in the following description, a potential of the source electrode of the MOS transistor 11, that is, a potential of the first terminal of the transfer switch 14 is referred to as "A potential". The A potential corresponds to the amount of charges accumulated in the capacitive portion 13.

The integration circuit $20_n$ includes an amplifier 21, a capacitive portion (second capacitive portion) 22, and a reset switch 23, and has a configuration of a capacitive transimpedance amplifier (CTIA). The integration circuit $20_n$ outputs a signal value according to the amount of charges accumulated in the capacitive portion 22 from an output terminal of the amplifier 21.

The amplifier 21 includes an inverting input terminal (first input terminal), a non-inverting input terminal (second input terminal), and an output terminal. Charges output from the transfer switch 14 of the unit detection element $10_{m,n}$ are input to the inverting input terminal of the amplifier 21 of the integration circuit $20_n$. An inp potential (reference potential) is input to the non-inverting input terminal of the amplifier 21. The output terminal of the amplifier 21 outputs an out signal.

The capacitive portion 22 is provided between the inverting input terminal and the output terminal of the amplifier 21, and accumulates charges input to the inverting input terminal of the amplifier 21. The reset switch 23 is provided in parallel with the capacitive portion 22. The reset switch 23 operates on the basis of the reset signal that is applied from the control unit 4A. When the reset switch 23 is in an ON-state, charge accumulation in the capacitive portion 22 is reset. When the reset switch 23 is in an OFF-state, the charge accumulation by the capacitive portion 22 is possible.

Figure 3:
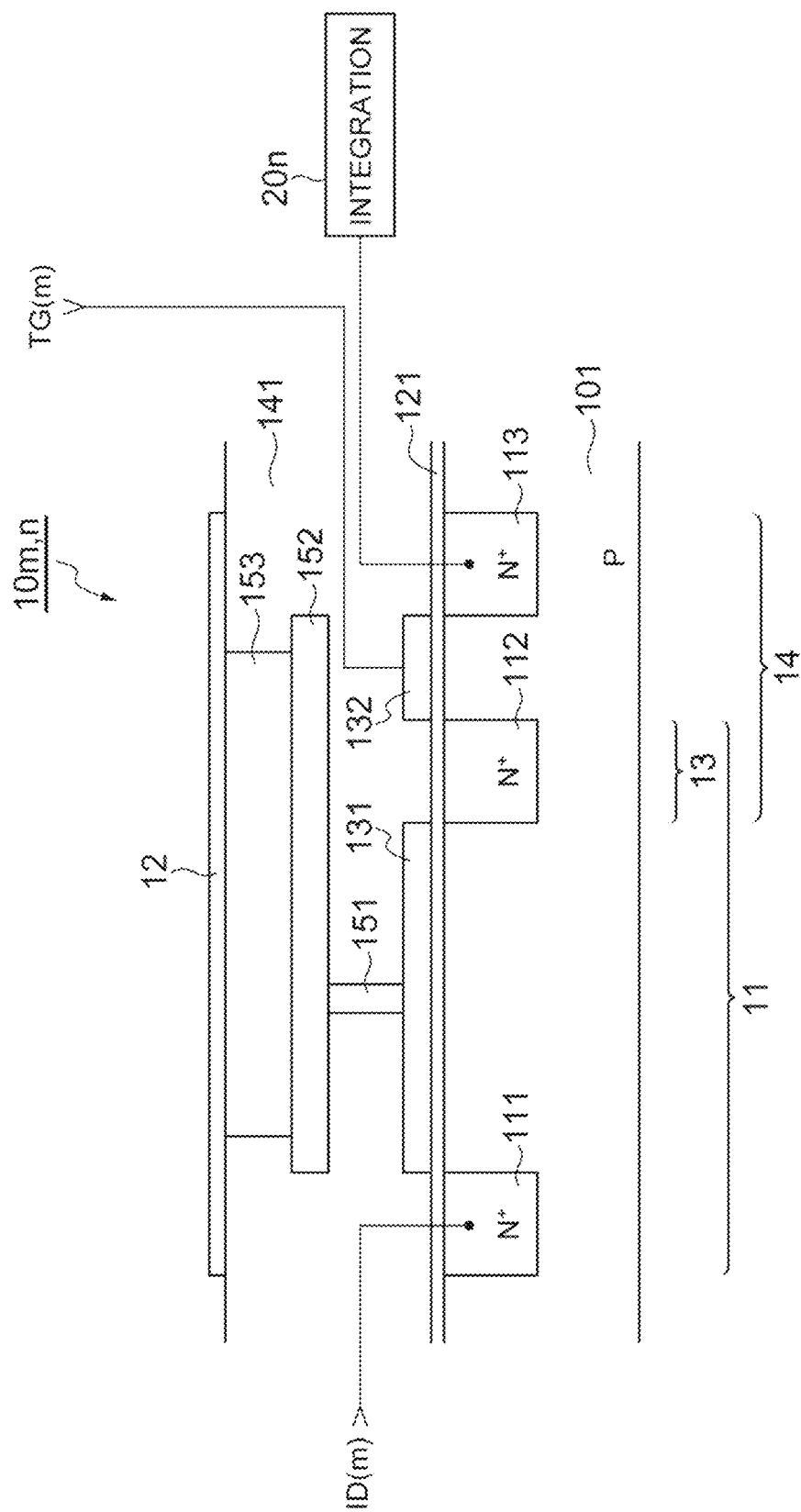
FIG. 3 is a view schematically illustrating a cross-sectional configuration example of the unit detection element $10_{m,n}$.

FIG. 3 is a view schematically illustrating a cross-sectional configuration example of the unit detection element $10_{m,n}$. As illustrated in the drawing, N$^+$-type regions 111 to 113 are formed on one principal surface of a P-type semiconductor substrate 101, an insulating film 121 is formed on these components, and further, gate electrodes 131 and 132 are formed on the insulating film 121. Parasitic capacitance of the N$^+$-type region 112 is used as the capacitive portion 13.

The gate electrode 131 is located between the N$^+$-type region 111 and the N$^+$-type region 112, and these components constitute the MOS transistor 11. The ID(m) signal is applied from the control unit 4A to the N$^+$-type region 111.

The gate electrode 132 is located between the N$^+$-type region 112 and the N$^+$-type region 113, and these components constitute the transfer switch 14. The TG(m) signal is applied from the control unit 4A to the gate electrode 132. The N$^+$-type region 113 is electrically connected to the integration circuit $20_n$.

An insulating layer 141 is formed on these components, and the ion sensitive portion 12 in a film shape is formed on the insulating layer 141. The ion sensitive portion 12 and the gate electrode 131 are electrically connected to each other by conductive materials 151 to 153.

Figure 4:
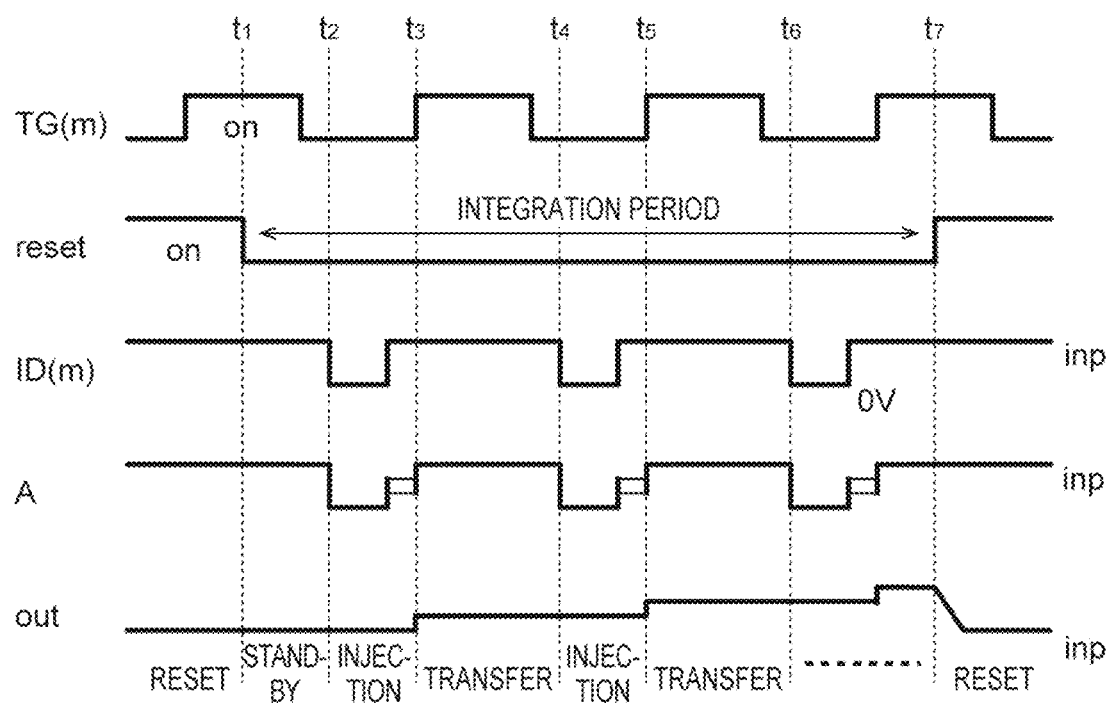
FIG. 4 is a timing chart illustrating an operation example of the unit detection element $10_{m,n}$ and the integration circuit $20_n$ of the ion concentration distribution measurement device 1A of the first embodiment.

FIG. 4 is a timing chart illustrating an operation example of the unit detection element $10_{m,n}$ and the integration circuit $20_n$ of the ion concentration distribution measurement device 1A of the first embodiment. In the drawing, an operation example of the unit detection element $10_{m,n}$ in an m-th row and an n-th column among the M×N unit detection elements $10_{1,1}$ to $10_{M,N}$, and the integration circuit $20_1$, among the N integration circuits $20_1$ to $20_N$ is illustrated.

Further, in the drawing, the TG(m) signal that is applied to the transfer switch 14 of the unit detection element $10_{m,n}$, the reset signal that is applied to the reset switch 23 of the integration circuit $20_n$, the ID(m) signal that is applied to the drain electrode of the MOS transistor 11 of the unit detection element $10_{m,n}$, the A potential of the source electrode of the MOS transistor 11 of the unit detection element $10_{m,n}$, and the out signal that is output from the output terminal of the amplifier 21 of the integration circuit $20_n$ are illustrated sequentially from an upper side.

A period before a time $t_1$ is a reset period. Before the time $t_1$, the reset signal is at an H-level, and in the integration circuit $20_n$, the reset switch 23 is in an ON-state, and charge accumulation in the capacitive portion 22 is initialized, and thus the out signal is set to an initial value. Further, the transfer switch 14 is in an ON-state, the inverting input terminal and the non-inverting input terminal of the amplifier 21 have an imaginary short relationship, and thus the A potential is reset to the inp potential level.

A period of the time $t_1$ to a time $t_2$ is a standby period. When the reset signal is switched to an L-level at the time $t_1$, in the integration circuit $20_n$, the reset switch 23 enters an OFF-state, and thus charge accumulation by the capacitive portion 22 becomes possible. The TG(m) signal is at an H-level, the ID(m) signal is at the inp potential level, the A potential is at the inp potential level without change, and the out signal remains at the initial value. Then, when the TG(m) signal is switched to an L-level, a state in which the out signal is the initial value is maintained.

A period of the time $t_2$ to a time $t_3$ is a charge injection period. The TG(m) signal is at the L-level, the transfer switch 14 is in an OFF-state, and thus the out signal remains at the initial value. The ID(m) signal becomes a ground potential level for a certain period after the time $t_2$, and charges of a certain amount are injected to the capacitive portion 13. Then, when the ID(m) signal returns to the inp potential level, the A potential (that is, the amount of charges accumulated in the capacitive portion 13) is according to a potential of the gate electrode of the MOS transistor 11 (that is, an ion concentration in a measurement object which is in contact with the ion sensitive portion 12).

A period of the time $t_3$ to a time $t_4$ is a charge transfer period. The TG(m) signal becomes the H-level for a certain period after the time $t_3$, and the transfer switch 14 enters an ON-state, and thus charges accumulated in the capacitive portion 13 are input to the integration circuit $20_n$ through the transfer switch 14, and are accumulated in the capacitive portion 22 of the integration circuit $20_n$. Further, the inverting input terminal and the non-inverting input terminal of the amplifier 21 have an imaginary short relationship, and thus the A potential returns to the inp potential level.

Then, when a charge injection period (the time $t_4$ to a time $t_5$) and a charge transfer period (the time $t_5$ to a time $t_6$) are repeated, charges are cumulatively accumulated in the capacitive portion 22 of the integration circuit $20_n$ with an amount according to the ion concentration. A voltage value according to the amount of charges cumulatively accumulated in the capacitive portion 22 is output from the integration circuit $20_n$.

A period after a time $t_7$ is a reset period. The reset signal becomes the H-level, and in the integration circuit $20_n$ the reset switch 23 enters an ON-state, the charge accumulation in the capacitive portion 22 is initialized, and the out signal becomes the initial value.

Figure 5:
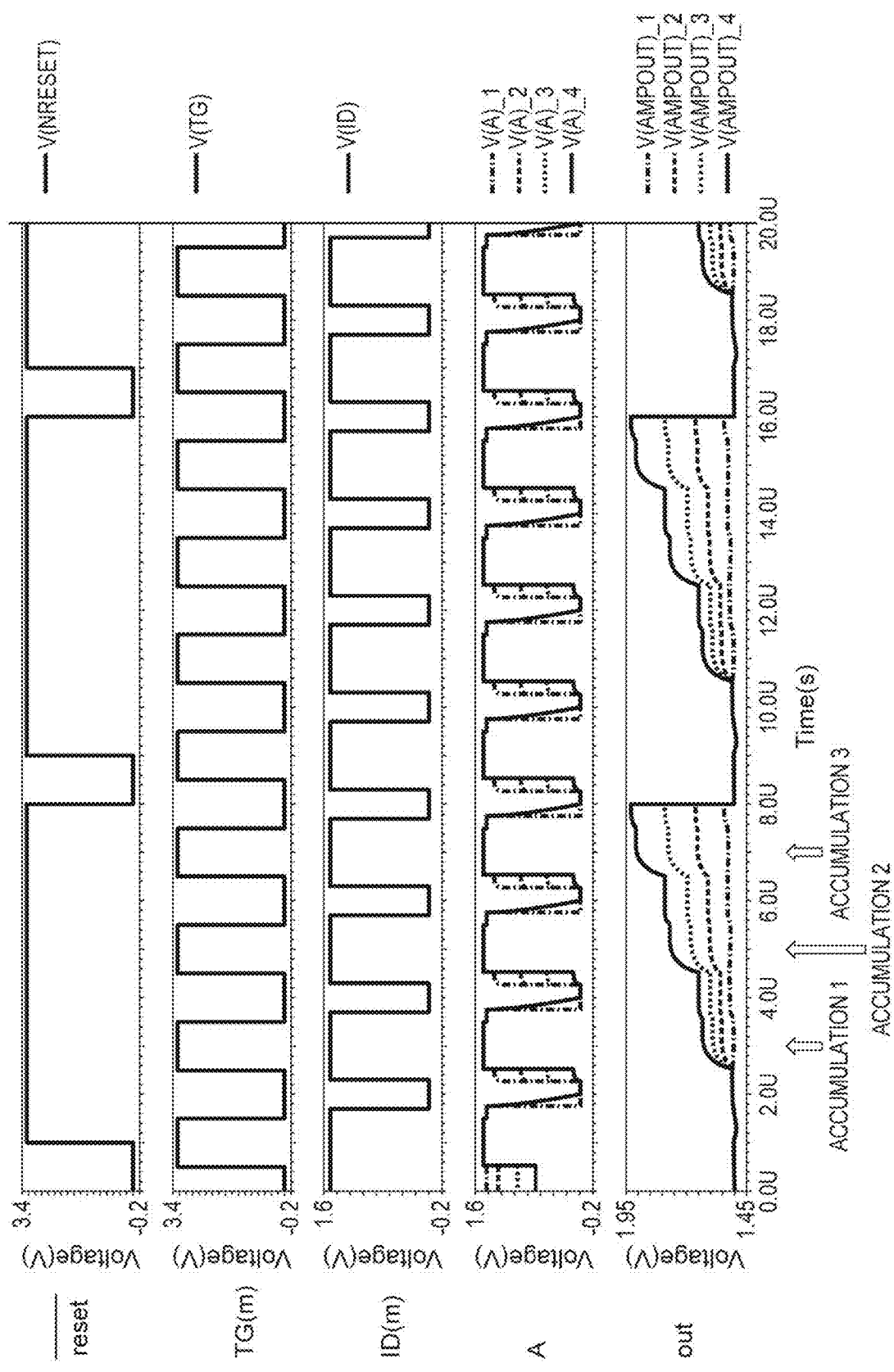
FIG. 5 is a view illustrating a simulation result of an operation of the unit detection element $10_{m,n}$ and the integration circuit $20_n$ of the ion concentration distribution measurement device 1A of the first embodiment.

FIG. 5 is a view illustrating a simulation result of the operation of the unit detection element $10_{m,n}$ and the integration circuit $20_n$ of the ion concentration distribution measurement device 1A of the first embodiment. Here, the inp potential level is set to 1.5 V, a capacitance value of the capacitive portion 22 is set to 0.1 pF, and the potential of the gate electrode of the MOS transistor 11 is set to each value of 0.5 V, 1.0 V, 1.5 V, and 2.0 V. Between a certain reset period and the subsequent reset period, the number of repetition times of the charge injection period and the charge transfer period (that is, the number of times of charge transfer to the capacitive portion 22 of the integration circuit $20_n$) is set to three times.

In the ion concentration distribution measurement device 1A of the present embodiment, charges of an amount according to the ion concentration are transferred from the unit detection element $10_{m,n}$ to the integration circuit $20_n$, the charges are accumulated in the integration circuit $20_n$, and an out signal of a value according to the amount of accumulated charges is output from the integration circuit $20_n$. Accordingly, in the ion concentration distribution measurement device 1A, even when a signal line up to reaching the integration circuit $20_n$ from the unit detection element $10_{m,n}$ is long, and parasitic capacitance of the signal line is large, a gain does not deteriorate, and thus the device is not easily influenced by noise, and can measure the ion concentration distribution with high accuracy.

Further, in the ion concentration distribution measurement device of the conventional art described in Non-Patent Document 1, when a voltage value according to the ion concentration is read out from the unit detection element $10_{m,n}$, the voltage value is small, and a gain deteriorates by capacitance of an output signal line, and thus the device is easily influenced by noise.

Further, in the ion concentration distribution measurement device 1A of the present embodiment, charges of an amount according to the ion concentration are cumulatively accumulated in the capacitive portion 22 of the integration circuit $20_n$, and a signal value according to the amount of charges cumulatively accumulated in the capacitive portion 22 can be output from the integration circuit $20_n$, and thus an SN ratio can be improved.

Further, in the ion concentration distribution measurement device 1A of the present embodiment, the ion sensitive portion 12 is provided to cover at least a part of both or any one of the MOS transistor 11 and the transfer switch 14, and thus it is possible to reduce a layout area of the unit detection element $10_{m,n}$ on the semiconductor substrate. According to this, it is possible to reduce an arrangement pitch of the unit detection elements on the semiconductor substrate, and thus it is possible to enhance spatial resolution in ion concentration distribution measurement.

Further, in the ion concentration distribution measurement device 1A of the present embodiment, charges of an amount according to the ion concentration may be accumulated in the capacitive portion 13 in the unit detection element $10_{m,n}$ in a sequential manner for every row of the detection unit 2A, and then the charges may be transferred from the unit detection element $10_{m,n}$ to the integration circuit $20_n$.

Alternatively, in the ion concentration distribution measurement device 1A of the present embodiment, charges of an amount according to the ion concentration may be accumulated in the capacitive portion 13 simultaneously in the all of the unit detection elements $10_{1,1}$ to $10_{M,N}$ of the detection unit 2A, and then the charges may be transferred from the unit detection element $10_{m,n}$ to the integration circuit $20_n$ in a sequential manner for every row of the detection unit 2A, and the out signal may be output from the integration circuit $20_n$.

Second Embodiment

Figure 6:
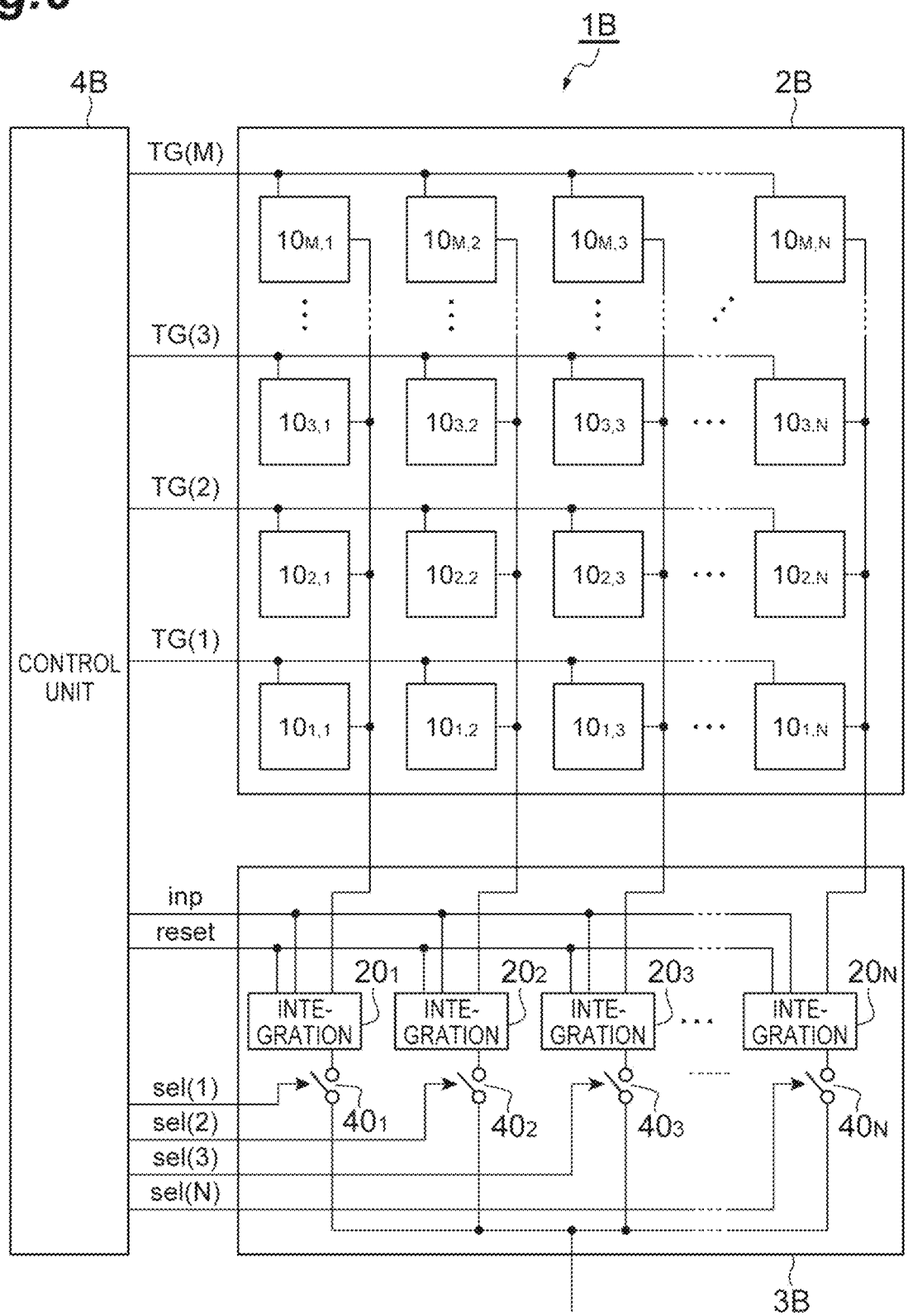
FIG. 6 is a diagram illustrating an entire configuration of an ion concentration distribution measurement device 1B of a second embodiment.

FIG. 6 is a diagram illustrating an entire configuration of an ion concentration distribution measurement device 1B of a second embodiment. The ion concentration distribution measurement device 1B includes a detection unit 2B, a signal processing unit 3B, and a control unit 4B. The configuration of the ion concentration distribution measurement device 1B of the second embodiment is different from the configuration of the first embodiment in a configuration of the unit detection element $10_{m,n}$ in a configuration in which the ID(m) signal is not applied from the control unit 4B to the detection unit 2B, and in a configuration in which the level of the inp signal that is applied from the control unit 4B to the integration circuit 20 is not constant.

Figure 7:
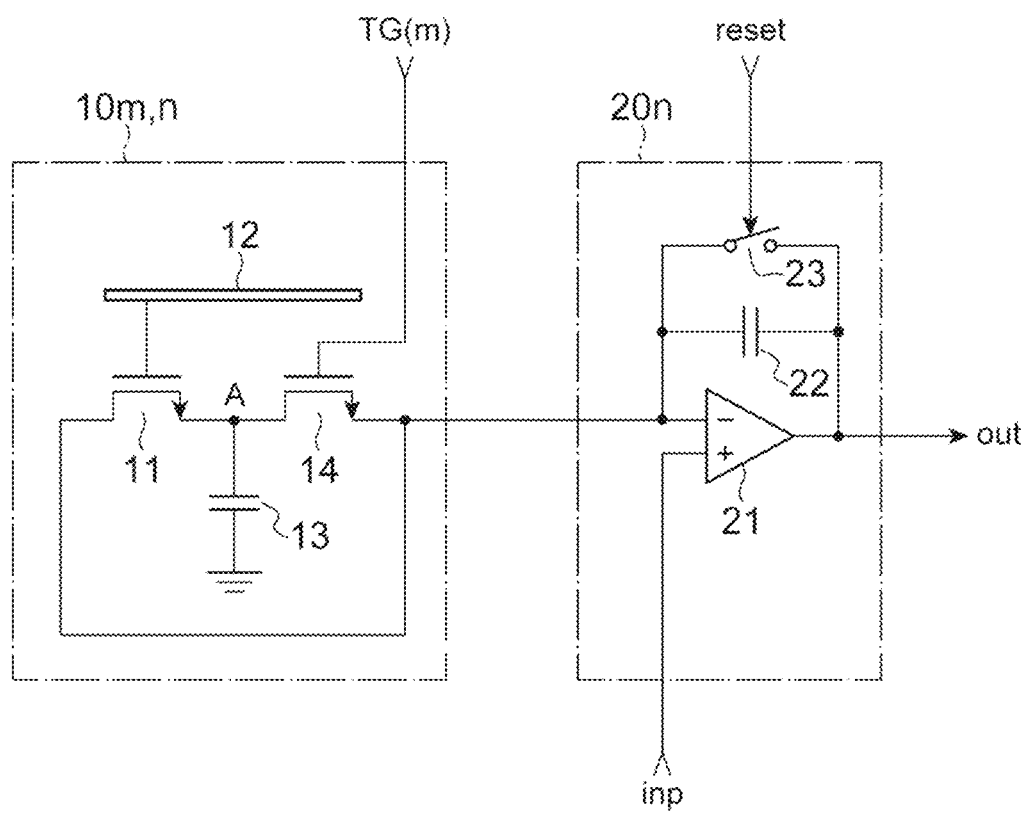
FIG. 7 is a diagram illustrating a circuit configuration example of a unit detection element $10_{m,n}$ and an integration circuit 20 of the ion concentration distribution measurement device 1B of the second embodiment.

FIG. 7 is a diagram illustrating a circuit configuration example of the unit detection element $10_{m,n}$ and the integration circuit $20_n$ of the ion concentration distribution measurement device 1B of the second embodiment. The configuration of the second embodiment is different from the configuration of the first embodiment in a configuration in which in the unit detection element $10_{m,n}$, the drain electrode (first electrode) of the MOS transistor 11 and the second terminal (terminal that is connected to the integration circuit $20_n$) of the transfer switch 14 are electrically connected to each other. Further, the configuration of the second embodiment is different from the configuration of the first embodiment in a configuration in which a level of the inp potential that is input to the non-inverting input terminal of the amplifier 21 of the integration circuit $20_n$ varies in a pulsed manner.

Figure 8:
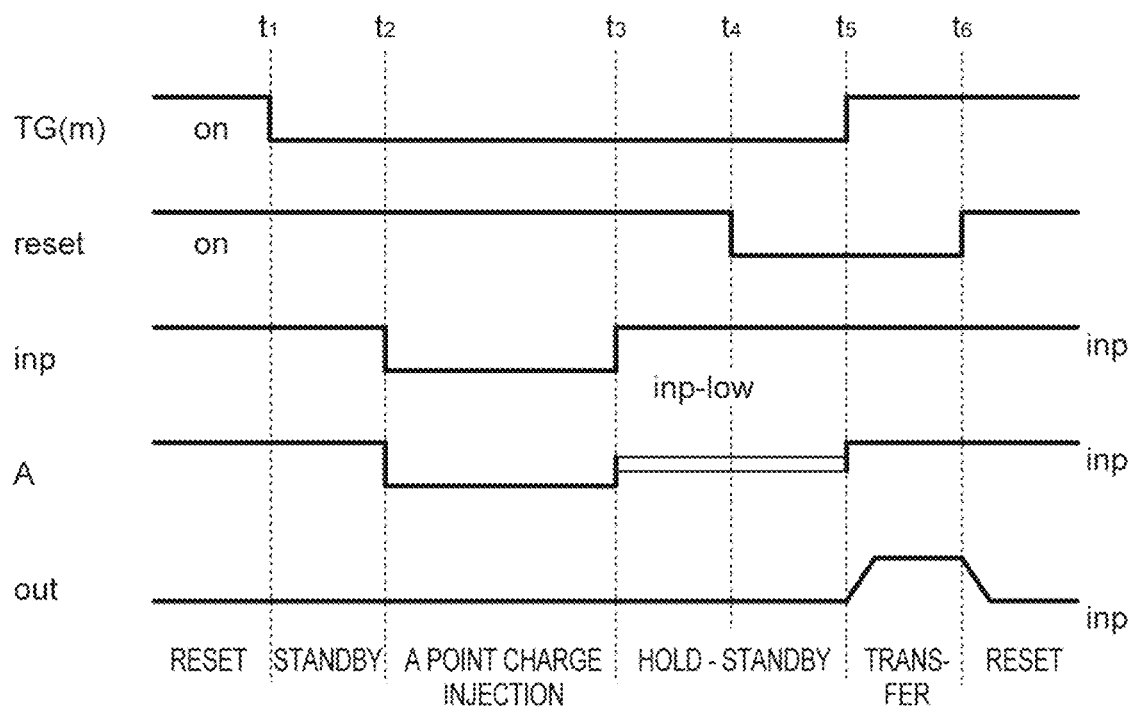
FIG. 8 is a timing chart illustrating an operation example of the unit detection element $10_{m,n}$ and the integration circuit $20_n$ of the ion concentration distribution measurement device 1B of the second embodiment.

FIG. 8 is a timing chart illustrating an operation example of the unit detection element $10_{m,n}$ and the integration circuit $20_n$ of the ion concentration distribution measurement device 1B of the second embodiment. In the drawing, the TG(m) signal that is applied to the transfer switch 14 of the unit detection element $10_{m,n}$, the reset signal that is applied to the reset switch 23 of the integration circuit $20_n$, the inp potential that is input to the non-inverting input terminal of the amplifier 21 of the integration circuit $20_n$, the A potential of the source electrode of the MOS transistor 11 of the unit detection element $10_{m,n}$ and the out signal that is output from the output terminal of the amplifier 21 of the integration circuit $20_n$ are illustrated sequentially from an upper side.

A period before a time $t_1$ is a reset period. Before the time $t_1$, the reset signal is at an H-level, and in the integration circuit $20_n$, the reset switch 23 is in an ON-state, and charge accumulation in the capacitive portion 22 is initialized, and thus the out signal is set to an initial value. The TG(m) signal is at an H-level, and the transfer switch 14 is in an ON-state. Further, the inp signal is at an H-level, the inverting input terminal and the non-inverting input terminal of the amplifier 21 have an imaginary short relationship, and thus the A potential is at the same H-level as in the inp signal.

A period of the time $t_1$ to a time $t_2$ is a standby period. The TG(m) signal is switched to an L-level, and thus the transfer switch 14 enters an OFF-state, but the A potential is at the same H-level as in the inp signal, and the out signal remains at the initial value.

A period of the time $t_2$ to a time $t_3$ is a charge injection period. In this period, the hip signal becomes an L-level, the inverting input terminal and the non-inverting input terminal of the amplifier 21 have an imaginary short relationship, and thus a voltage that is applied to the drain electrode of the MOS transistor 11 becomes the L-level of the inp signal, and charges of a certain amount are injected to the capacitive portion 13.

A period of the time $t_3$ to a time $t_4$ is a charge hold period. In this period, the inp signal becomes the H-level, and the A potential (that is, the amount of charges accumulated in the capacitive portion 13) is according to a potential of the gate electrode of the MOS transistor 11 (that is, an ion concentration in a measurement object which is in contact with the ion sensitive portion 12).

A period of the time $t_4$ to a time $t_5$ is a standby period. When the reset signal is switched to the L-level at the time $t_4$, in the integration circuit $20_n$, the reset switch 23 enters an OFF-state, and charge accumulation by the capacitive portion 22 becomes possible.

A period of the time $t_5$ to a time $t_6$ is a charge transfer period. The TG(m) signal becomes the H-level, and the transfer switch 14 enters an ON-state, and accordingly, the charges accumulated in the capacitive portion 13 are input to the integration circuit $20_n$ through the transfer switch 14, and are accumulated in the capacitive portion 22 of the integration circuit $20_n$. A voltage value according to the amount of charges accumulated in the capacitive portion 22 is output from the integration circuit $20_n$. Further, the inverting input terminal and the non-inverting input terminal of the amplifier 21 have an imaginary short relationship, and thus the A potential returns to the H-level of the inp potential.

A period after the time $t_6$ is a reset period. The reset signal becomes the H-level, and in the integration circuit $20_n$, the reset switch 23 enters an ON-state, the charge accumulation in the capacitive portion 22 is initialized, and the out signal becomes the initial value.

In addition to exhibition of the same effect as in the case of the first embodiment, the ion concentration distribution measurement device 1B of the second embodiment exhibits the following effect. In the second embodiment, since it is not necessary to apply the ID(m) signal from the control unit 4B to the detection unit 2B, it is possible to reduce the arrangement pitch of the unit detection elements on the semiconductor substrate by omission of a signal line for applying, and thus it is possible to further enhance spatial resolution in the ion concentration distribution measurement.

Further, in the ion concentration distribution measurement device 1B of the second embodiment, the amount of charges which are injected to the capacitive portion 13 of the unit detection element $10_{m,n}$ in the charge injection period is defined by the inp potential that is input to the non-inverting input terminal of the amplifier 21 of the integration circuit $20_n$, and thus it is possible to suppress an influence due to variation of an amplifier offset.

Third Embodiment

Figure 9:
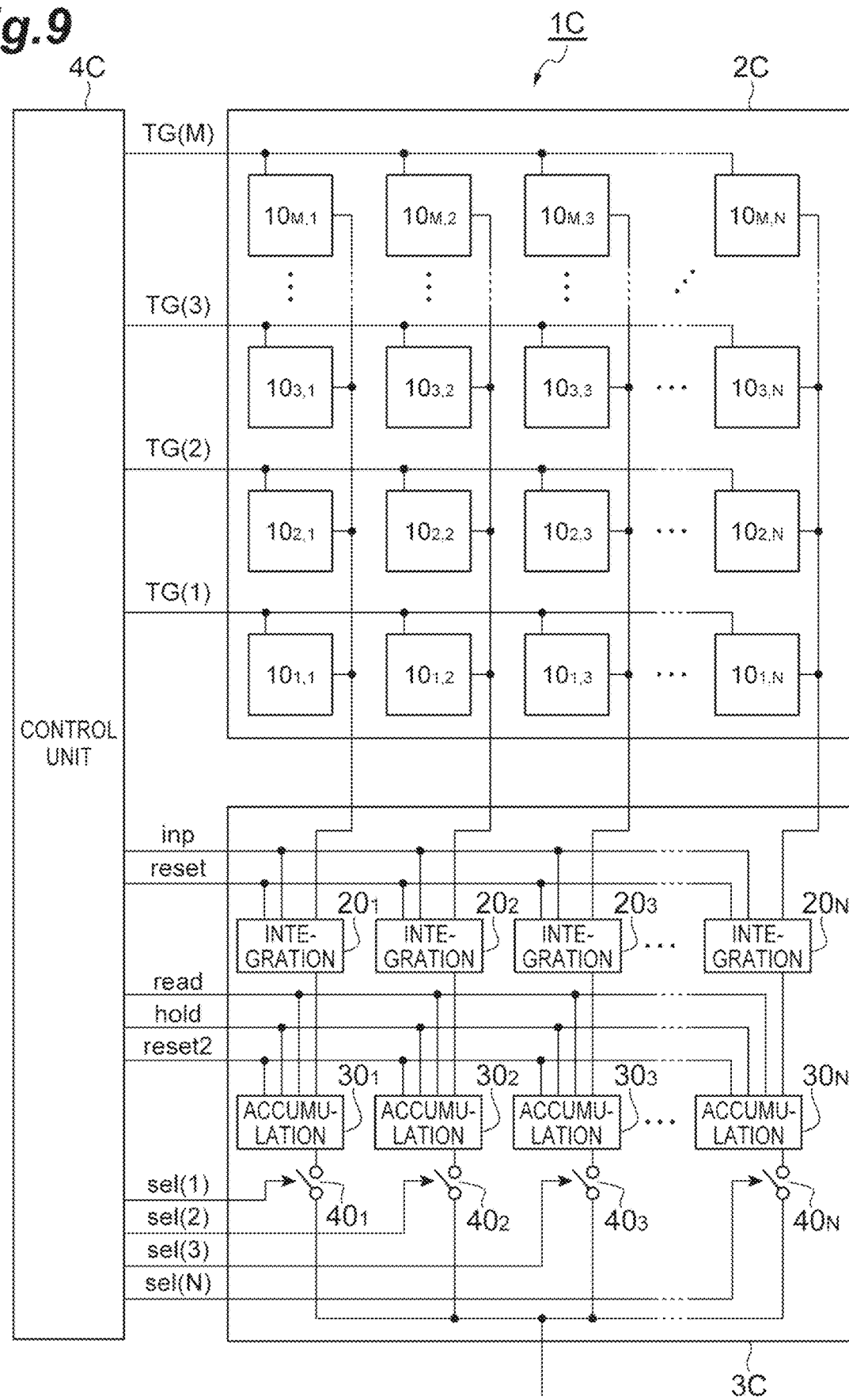
FIG. 9 is a diagram illustrating an entire configuration of an ion concentration distribution measurement device 1C of a third embodiment.

FIG. 9 is a diagram illustrating an entire configuration of an ion concentration distribution measurement device 1C of a third embodiment. The ion concentration distribution measurement device 1C includes a detection unit 2C, a signal processing unit 3C, and a control unit 4C. The configuration of the ion concentration distribution measurement device 1C of the third embodiment is different from the configuration of the second embodiment in a configuration in which the signal processing unit 3C further includes N accumulation circuits $30_1$ to $30_N$, and in a configuration in which a read signal, a hold signal, and a reset2 signal are applied from the control unit 4C to each accumulation circuit $30_n$. The detection unit 2C in the third embodiment has the same configuration as in the detection unit 2B in the second embodiment.

In the signal processing unit 3C, the accumulation circuit $30_n$ is provided between the integration circuit $20_n$ and the switch $40_n$. The accumulation circuit $30_n$ operates on the basis of the read signal, the hold signal, and the reset2 signal which are applied from the control unit 4C. The accumulation circuit $30_n$ cumulatively adds signal values which are output from the integration circuit $20_n$, and outputs a signal value after the cumulative addition to the switch $40_n$.

Figure 10:
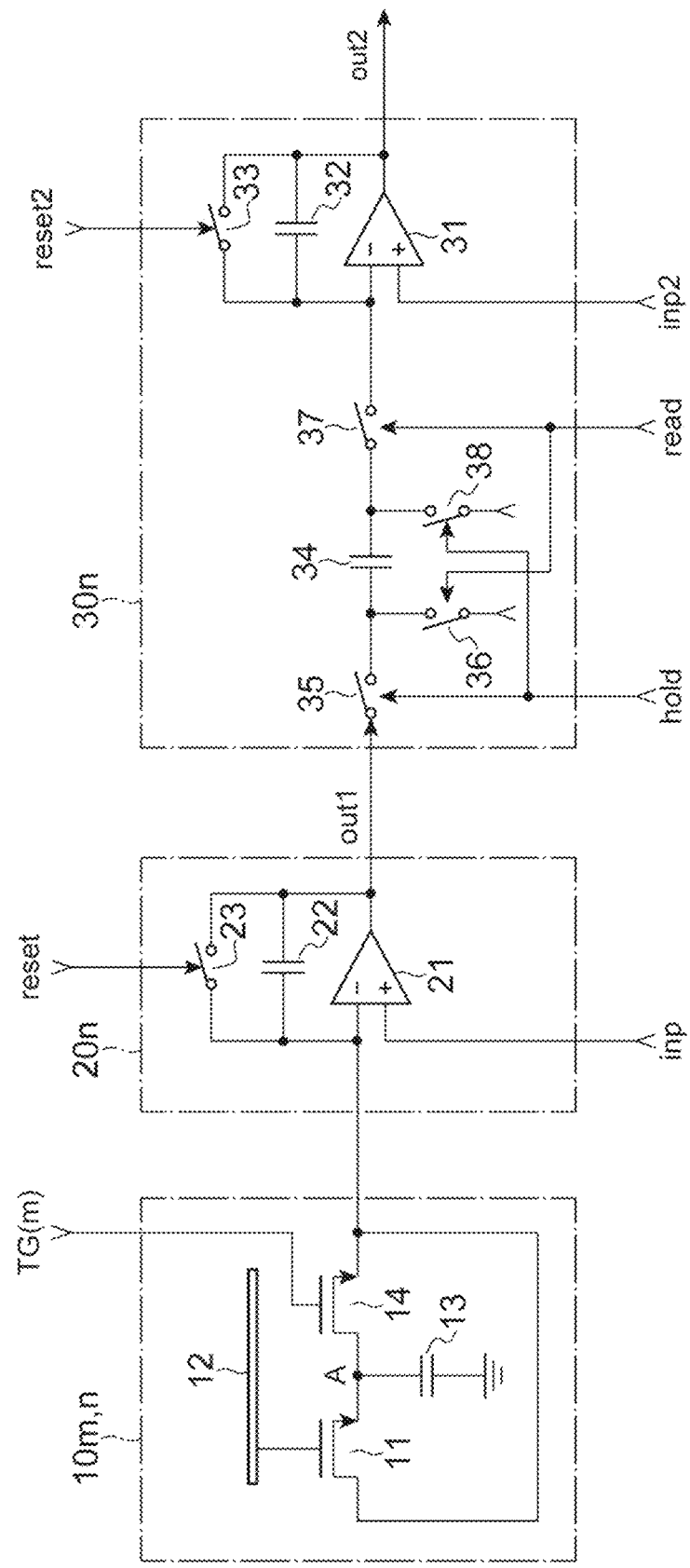
FIG. 10 is a diagram illustrating a circuit configuration example of a unit detection element $10_{m,n}$, an integration circuit $20_n$, and an accumulation circuit $30_n$ of the ion concentration distribution measurement device 1C of the third embodiment.

FIG. 10 is a diagram illustrating a circuit configuration example of the unit detection element $10_{m,n}$, the integration circuit $20_n$, and the accumulation circuit $30_n$ of the ion concentration distribution measurement device 1C of the third embodiment. The unit detection element $10_{m,n}$ in the third embodiment has the same configuration as in the unit detection element $10_{m,n}$ in the second embodiment. The integration circuit $20_n$ in the third embodiment has the same configuration as in the integration circuit $20_n$ in the second embodiment.

The accumulation circuit $30_n$ includes an amplifier 31, a capacitive portion 32, a reset switch 33, a capacitive portion 34, and switches 35 to 38. The amplifier 31, the capacitive portion 32, and the reset switch 33 in the accumulation circuit $30_n$ have the same configuration as in the amplifier 21, the capacitive portion 22, and the reset switch 23 in the integration circuit $20_n$ (that is, a configuration of CTIA). The reset switch 33 operates on the basis of the reset2 signal that is applied from the control unit 4C.

The capacitive portion 34, and the switches 35 to 38 constitute a switched capacitor circuit. One end of the capacitive portion 34 is connected to an output terminal of the amplifier 21 of the integration circuit $20_n$ through the switch 35, and is connected to a reference potential input terminal through the switch 36. The other end of the capacitive portion 34 is connected to an inverting input terminal of the amplifier 31 through the switch 37, and is connected to a reference potential input terminal through the switch 38.

The switch 35 and the switch 38 operate on the basis of the hold signal that is applied from the control unit 4C. The switch 36 and the switch 37 operate on the basis of the read signal that is applied from the control unit 4C. The switches 35 and 38, and the switches 36 and 37 do not simultaneously enter an ON-state. The accumulation circuit 30 accumulates charges in the capacitive portion 34 with an amount according to a value of an out1 signal that is output from the integration circuit $20_n$ when the switches 35 and 38 are in an ON-state, and transfers the charges accumulated in the capacitive portion 34 to the inverting input terminal of the amplifier 31 and cumulatively accumulates the charges in the capacitive portion 32 when the switches 36 and 37 are in an ON-state.

Figure 11:
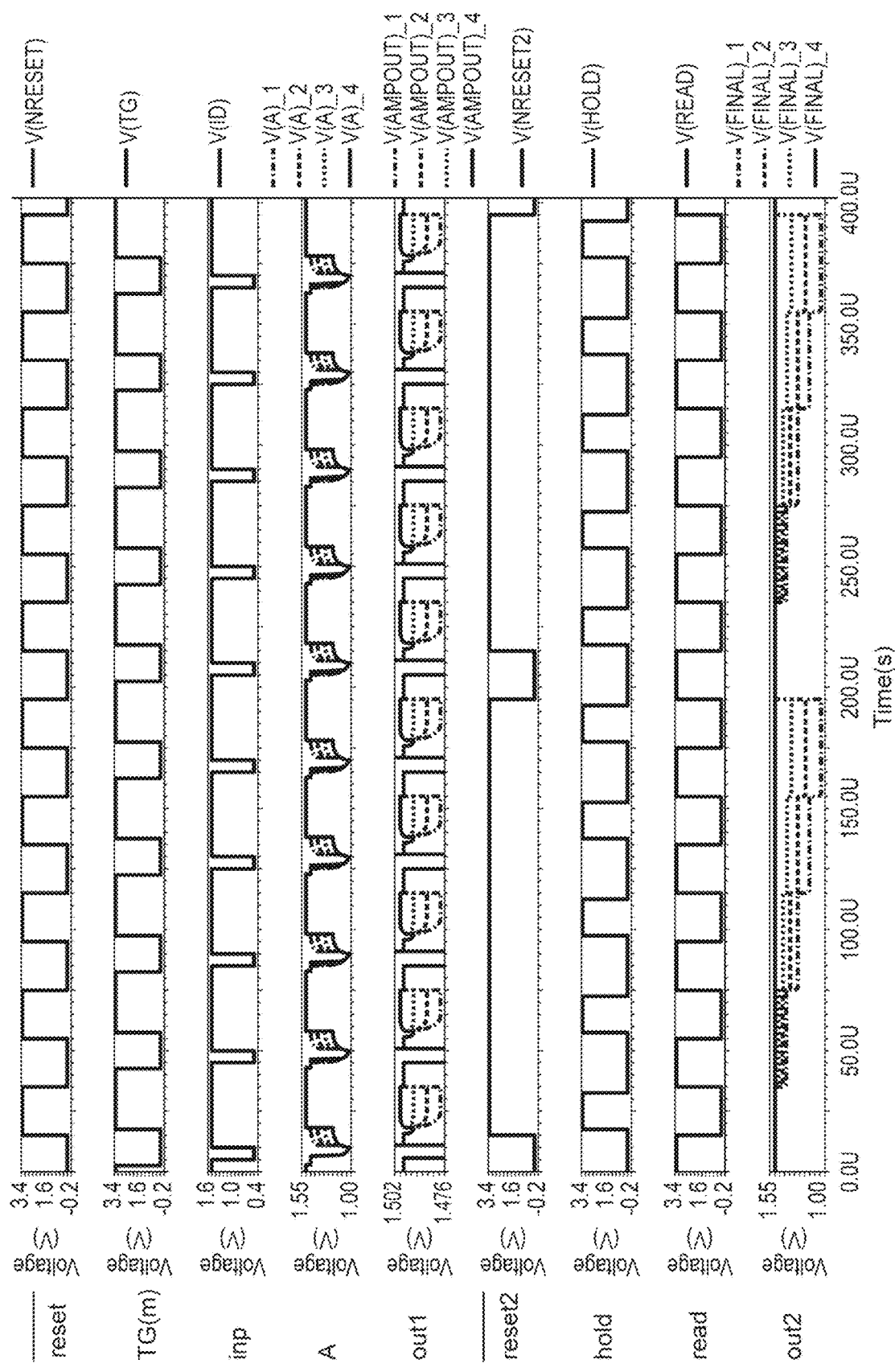
FIG. 11 is a view illustrating a simulation result of an operation of the unit detection element $10_{m,n}$, the integration circuit $20_n$, and the accumulation circuit $30_n$ of the ion concentration distribution measurement device 1C of the third embodiment.

FIG. 11 is a view illustrating a simulation result of the operation of the unit detection element $10_{m,n}$, the integration circuit $20_n$, and the accumulation circuit $30_n$ of the ion concentration distribution measurement device 1C of the third embodiment. In the drawing, the reset signal that is applied to the reset switch 23 of the integration circuit $20_n$, the TG(m) signal that is applied to the transfer switch 14 of the unit detection element $10_{m,n}$, the inp potential that is input to the non-inverting input terminal of the amplifier 21 of the integration circuit $20_n$, the A potential of the source electrode of the MOS transistor 11 of the unit detection element $10_{m,n}$, and the out1 signal that is output from the output terminal of the amplifier 21 of the integration circuit $20_n$ are illustrated sequentially from an upper side. Further, the reset2 signal that is applied to the reset switch 33 of the accumulation circuit $30_n$, the hold signal that is applied to the switches 35 and 38 of the accumulation circuit $30_n$, the read signal that is applied to the switches 36 and 37 of the accumulation circuit $30_n$, and an out2 signal that is output from an output terminal of the amplifier 31 of the accumulation circuit $30_n$ are illustrated.

Here, a reference potential that is applied to one end of the switches 36 and 38 is set to 1.5 V, a capacitance value of the capacitive portion 22 is set to 0.1 pF, and the potential of the gate electrode of the MOS transistor 11 is set to each value of 1.8 V, 1.9 V, 2.0 V, and 2.1 V. Between a certain reset period and the subsequent reset period, the number of repetition times of the charge injection period and the charge transfer period (that is, the number of times of charge transfer to the capacitive portion 22 of the integration circuit $20_n$) is set to four times.

In addition to exhibition of the same effect as in the case of the second embodiment, the ion concentration distribution measurement device 1C of the third embodiment cumulatively accumulates charges of an amount according to the ion concentration in the capacitive portion 32 of the accumulation circuit $30_n$, and can output a signal value according to the amount of charges which are cumulatively accumulated in the capacitive portion 32 from the accumulation circuit $30_n$, and thus it is possible to improve the SN ratio.

(Modification)

The present invention is not limited to the embodiments and the configuration examples described above, and various modifications can be made. For example, in the detection unit, the plurality of unit detection elements may be two-dimensionally arranged or may be one-dimensionally arranged. In the above embodiments, one integration circuit is provided corresponding to M unit detection elements in each column among the plurality of unit detection elements which are arranged in M rows and N columns, however, in general, one integration circuit may be provided corresponding to two or more unit detection elements, or one integration circuit may be provided corresponding to one unit detection element.

The ion concentration distribution measurement device according to the above embodiments is configured to include a detection unit including a plurality of unit detection elements each outputting charges of an amount according to an ion concentration arranged and formed one-dimensionally or two-dimensionally on a semiconductor substrate; and a signal processing unit including one or two or more integration circuits each outputting a signal value according to the amount of charges output from the unit detection element.

In the ion concentration distribution measurement device of the above configuration, the unit detection element includes (1) a MOS transistor including a first electrode, a second electrode, and a gate electrode, (2) an ion sensitive portion electrically connected to the gate electrode of the MOS transistor, and applying a potential according to the ion concentration to the gate electrode, (3) a first capacitive portion provided between the second electrode of the MOS transistor and a reference potential input terminal, and accumulating charges of an amount according to the potential of the gate electrode, and (4) a transfer switch including a first terminal and a second terminal, and outputting charges accumulated in the first capacitive portion from the second terminal, the first terminal being electrically connected to the second electrode of the MOS transistor. Here, one electrode in the first electrode and the second electrode of the MOS transistor is a drain electrode, and the other electrode is a source electrode.

In the ion concentration distribution measurement device of the above configuration, the integration circuit includes (1) an amplifier including a first input terminal to which charges output from any one unit detection element among the plurality of unit detection elements are input, a second input terminal to which a reference potential is input, and an output terminal outputting a signal value, (2) a second capacitive portion provided between the first input terminal and the output terminal of the amplifier, and accumulating charges input to the first input terminal of the amplifier, and (3) a reset switch provided in parallel with the second capacitive portion, and resetting charge accumulation in the second capacitive portion. The integration circuit outputs a signal value according to the amount of charges accumulated in the second capacitive portion from the output terminal of the amplifier.

In the ion concentration distribution measurement device of the above configuration, the ion sensitive portion may be provided to cover at least a part of both or any one of the MOS transistor and the transfer switch.

In the ion concentration distribution measurement device of the above configuration, one integration circuit may be provided corresponding to two or more unit detection elements among the plurality of unit detection elements.

In the ion concentration distribution measurement device of the above configuration, the plurality of unit detection elements may be arranged two-dimensionally in M rows and N columns (where M and N are each an integer of 2 or more), the signal processing unit may include N integration circuits, and one integration circuit may be provided corresponding to M unit detection elements in each column among the plurality of unit detection elements.

In the ion concentration distribution measurement device of the above configuration, in each of the unit detection elements, the first electrode of the MOS transistor and the second terminal of the transfer switch may be electrically connected to each other. Further, in this case, the signal processing unit may further include an accumulation circuit cumulatively adding signal values output from the integration circuit.

INDUSTRIAL APPLICABILITY

The present invention can be used as an ion concentration distribution measurement device that is not easily influenced by noise.

REFERENCE SIGNS LIST 1A-1C—ion concentration distribution measurement device, 2A-2C—detection unit, 3A-3C—signal processing unit, 4A-4C—control unit, $10_{1,1}$-$10_{M,N}$—unit detection element, 11—MOS transistor, 12—ion sensitive portion, 13—capacitive portion, 14—transfer switch, $20_1$-$20_N$—integration circuit, 21—amplifier, 22—capacitive portion, 23—reset switch, $30_1$-$30_N$—accumulation circuit, 31—amplifier, 32—capacitive portion, 33—reset switch, 34—capacitive portion, 35-38—switch.

The invention claimed is:

1. An ion concentration distribution measurement device comprising:
   a detection unit including a plurality of unit detection elements each configured to output charges of an amount according to an ion concentration arranged and formed one-dimensionally or two-dimensionally on a semiconductor substrate; and a signal processing unit including one or two or more integration circuits each configured to output a signal value according to the amount of charges output from the unit detection element, wherein each of the unit detection elements includes:

a MOS transistor including a first electrode, a second electrode, and a gate electrode, an ion sensitive portion electrically connected to the gate electrode of the MOS transistor, and configured to apply a potential according to the ion concentration to the gate electrode, a first capacitive portion provided between the second electrode of the MOS transistor and a reference potential input terminal, and configured to accumulate charges of an amount according to the potential of the gate electrode, and a transfer switch including a first terminal and a second terminal, and configured to output charges accumulated in the first capacitive portion from the second terminal, the first terminal being electrically connected to the second electrode of the MOS transistor, each of the integration circuits includes:

an amplifier including a first input terminal to which charges output from any one unit detection element among the plurality of unit detection elements are input, a second input terminal to which a reference potential is input, and an output terminal outputting a signal value, a second capacitive portion provided between the first input terminal and the output terminal of the amplifier, and configured to accumulate charges input to the first input terminal of the amplifier, and a reset switch provided in parallel with the second capacitive portion, and configured to reset charge accumulation in the second capacitive portion, and a signal value according to the amount of charges accumulated in the second capacitive portion is output from the output terminal of the amplifier.

2. The ion concentration distribution measurement device according to claim 1, wherein the ion sensitive portion is provided to cover at least a part of both or any one of the MOS transistor and the transfer switch.

3. The ion concentration distribution measurement device according to claim 1, wherein one integration circuit is provided corresponding to two or more unit detection elements among the plurality of unit detection elements.

4. The ion concentration distribution measurement device according to claim 1, wherein the plurality of unit detection elements are arranged two-dimensionally in M rows and N columns (where M and N are each an integer of 2 or more), the signal processing unit includes N integration circuits, and one integration circuit is provided corresponding to M unit detection elements in each column among the plurality of unit detection elements.

5. The ion concentration distribution measurement device according to claim 1, wherein in each of the unit detection elements, the first electrode of the MOS transistor and the second terminal of the transfer switch are electrically connected to each other.

6. The ion concentration distribution measurement device according to claim 5, wherein the signal processing unit further includes an accumulation circuit configured to cumulatively add signal values output from the integration circuit.

* * * * *